US006544345B1

(12) United States Patent
Mayer et al.

(10) Patent No.: US 6,544,345 B1
(45) Date of Patent: Apr. 8, 2003

(54) METHOD AND SYSTEM FOR IN-SITU CLEANING OF SEMICONDUCTOR MANUFACTURING EQUIPMENT USING COMBINATION CHEMISTRIES

(75) Inventors: Bruce E. Mayer, Soquel; Robert H. Chatham, III, Scotts Valley; Nitin K. Ingle, Campbell; Zheng Yuan, Fremont, all of CA (US)

(73) Assignee: Asml US, Inc., Scotts Valley, CA (US)

(*) Notice: Subject to any disclaimer, the term of this patent is extended or adjusted under 35 U.S.C. 154(b) by 172 days.

(21) Appl. No.: 09/615,035

(22) Filed: Jul. 12, 2000

Related U.S. Application Data

(60) Provisional application No. 60/143,285, filed on Jul. 12, 1999.

(51) Int. Cl.[7] .................................................. B08B 7/04

(52) U.S. Cl. ............................ 134/28; 134/1.2; 134/26; 134/30; 134/22.1; 134/22.18; 438/905

(58) Field of Search .............................. 134/1, 1.1, 1.2, 134/1.3, 2, 3, 22.1, 22.18, 26, 28, 30; 438/905

(56) References Cited

U.S. PATENT DOCUMENTS 4,976,996 A 12/1990 Monkowski et al. ..... 427/255.5
5,091,219 A 2/1992 Monkowski et al. ..... 427/255.5
5,620,526 A 4/1997 Watatani et al. ............. 134/1.1
5,658,417 A 8/1997 Watanabe et al. ........... 156/345
5,679,215 A 10/1997 Barnes et al. ............ 156/646.1
5,716,495 A 2/1998 Butterbaugh et al. ..... 156/643.1
5,756,400 A 5/1998 Ye et al.
5,788,778 A 8/1998 Shang et al. .................... 134/1
5,843,239 A 12/1998 Shrotriya ..................... 134/1.1

FOREIGN PATENT DOCUMENTS

DE 4132559.1 4/1993 ............. C23F/4/00
EP 0697467 2/1996 ........... C23C/16/44

OTHER PUBLICATIONS

Xia, et al. "High Aspect Ratio Trench Filling Using Two–Step Subatmospheric Chemical Vapor Deposition Borophosphosilicate Glass <0.18μm Device Application", Journal of the Electrochemical Society, vol. 146, 1999, pp. 1884–1888.

Xia, et al. "High Temperature Subatmospheric Chemical Vapor Deposited Undoped Silicate Glass; A Solution for Next Generation Shallow Trench Isolation", Journal of the Electrochemical Society, vol. 146, pp. 1181–1185.

Mendicino, et al., "Motorola Evaluation of the Applied Science and Technology, Inc. (ASTeX) ASTRON Technology for Perfluorocompound (PFC) Emissions Reductions on the Applied Materials DxL Chemical Vapor Deposition (CVD) Chamber", International SEMATECH Technology Tranfer # 99033697A–TR Apr. 16, 1999, 33 pgs.

*Primary Examiner*—Alexander Markoff
(74) *Attorney, Agent, or Firm*—Dorsey & Whitney LLP

(57) ABSTRACT

An in-situ, two step or combination, method and system for cleaning of semiconductor manufacturing equipment is provided. The present invention utilizes two separate fluorine based chemistries in each step which selectively target the removal of different types of deposits that build up on the equipment surfaces. In particular, powdery and dense film-like solid deposits, as well as a combination of both, build up on the chamber surfaces and associated equipment components. These two types of deposits are removed selectively by the present invention. Such selective targeting of combined cleaning steps, yields an improved cleaning technique. In another embodiment, the method and system of the present invention provides for cleaning of the chamber and associated equipment using separate steps with different chemicals, and then performing these steps in a variety of desired sequences.

21 Claims, 8 Drawing Sheets

| DESIGNATOR LEGEND | |
|---|---|
| DESIGNATOR | DESCRIPTON |
| CV | CHEMICAL VALUE |
| TV | THROTTLE VALUE |
| IV | INERT VALUE |
| MFC | MASS FLOW CONTROLLER |
| MV | MANUAL VALVE |
| OR | ORIFICE |
| PS | PRESSURE SWITCH |
| VV | VACUUM VALVE |

200mm Wafer Cost–To–Clean Calculation

| Clean Chemistry | Source Chemicals | Source Chemicals Flow Rate (slpm) | Chem Cost (&/sl) | DownTime Cost ([$/wfr] per Cin–min) | Gas–On Clean Time[i] (minutes/lot) | | | | Clean Cost ($/wafer) | | | |
|---|---|---|---|---|---|---|---|---|---|---|---|---|
| | | | | | BPSG | | USG | | BPSG | | USG | |
| | | | | | Film | Pwdr | Film | Pwdr | Film | Pwdr | Film | Pwdr |
| HF | aHF | 2.0 | $0.123 | 0.011 | 41.7 | 12.5 | n/a[ii] | 62.5 | 0.87 | .026 | $\infty$[ii] | 1.30 |
| atomic–F | $NF_3$ | 1.2 | $0.92 | 0.011 | 41.7 | 7.35 | 20.8 | 20.8 | 0.23 | 0.41 | 1.15 | 1.15 |

NOTES i. For a lot of 25 wafers, each coated with 0.5 μm of the BPSG or USG film (12.5 μm accumulated deposition between cleans):

- Pre & Post purge times assumed to be roughly equal for both aHF and atomic–F cleans ii. "n/a" denotes "not applicable".

iii. Gas–On Clean Times based on the Clean Rate values shown in Table 1.

*FIG. 8*

METHOD AND SYSTEM FOR IN-SITU CLEANING OF SEMICONDUCTOR MANUFACTURING EQUIPMENT USING COMBINATION CHEMISTRIES

RELATED APPLICATIONS

This patent application claims the benefit of U.S. provisional patent application Ser. No. 60/143,285 filed on Jul. 12, 1999, the entire disclosure of which is herein incorporated by reference.

FIELD OF THE INVENTION

The present invention relates in general to cleaning semiconductor equipment; and more particularly, to a method and system for in-situ cleaning of semiconductor manufacturing equipment, such as silicon dioxide deposition chambers, using a two step, combination of chemistries.

BACKGROUND OF THE INVENTION

Semiconductor manufacturing equipment is widely employed to fabricate electronic devices and integrated circuits on substrates or wafers. Many different types of semiconductor equipment are used in the fabrication process, such as for example: heat treatment chambers used for thermal annealing, oxidation, nitridation and the like, and chemical vapor deposition (CVD) chambers used to deposit thin films. In particular, deposition of thin films of doped and undoped silicon oxide ($SiO_x$), also called silicate glass (SG), find wide application in the production of electronic devices. The chamber used to deposit these films often uses thermally driven chemical reactions. CVD chambers, and associated equipment components such as injectors and the like, used to deposit undoped $SiO_x$ films (USG), and doped $SiO_x$ films with boron (B) and phosphorous (P) such as $B_ySiO_x$ (BSG), $P_zSiO_x$ (PSG), and $B_yP_zSiO_x$ (BPSG) often become fouled with solid silicate byproducts of the deposition process. If sufficient solid byproducts build up on the internal surfaces of the chamber, these by products can flake, or spall, from the chamber surfaces and contaminate the substrate or wafer with detrimental particulate solids. The spalling byproduct deposits often land on a wafer-in-process resulting in particle contamination of the integrated circuits. To avoid this particulate contamination the chamber interior and associated equipment components must be periodically cleaned.

Various cleaning techniques have been employed in the art. Manual cleaning of the chambers, and associated equipment components, has been used; however this technique is undesirable due to high labor costs and downtime.

Another technique used in the art is a one step in-situ process, such as that described in U.S. Pat. No. 5,788,778. As described in the '778 patent, a precursor gas is activated in a remote chamber via a high power source to form a reactive species which is then flowed into the deposition chamber to clean the inside of the deposition chamber. While this technique provides advantages over the manual method, it also has limitations. For example, cleaning rates are still relatively low which results in significant downtime, with the corresponding reduction in product throughput. Further, the cost of the chemicals are high. For example, in the '778 patent, $NF_3$ may be used in a high power generator to create reactive species for the complete cleaning process, which is very costly. Thus it is desirable to provide an improved method and system for cleaning the chambers.

SUMMARY OF THE INVENTION

Accordingly, it is an object of the present invention to provide an improved method and system for cleaning of semiconductor manufacturing equipment.

More particularly, it is an object of the present invention to provide a method and system for in-situ cleaning of semiconductor manufacturing equipment using a combination of a two step process which uses chemicals that selectively target the different types of solid deposits that build up on the chamber and equipment.

For example, in one embodiment, the invention provides a method and system for in-situ, chemical-etch cleaning of chambers and associated equipment components, by using a combination of anhydrous Hydrogen Fluoride (aHF) and atomic Fluorine (atomic-F) in a two step process. The inventors have discovered that the effectiveness of these two different fluorine chemistries vary with the nature of the type of solid deposits, which are either powdery, or dense and film-like, or a combination of both. The inventors have found that aHF quickly and inexpensively removes powdery deposits, while atomic-F quickly and inexpensively removes dense film-like deposits. Other fluorine containing chemicals may be used as described below. The present invention selectively targets the chemicals for cleaning of the deposits for which the individual chemical is most capable; yielding an overall more effective combined cleaning method. This improved method and system of cleaning reduces the chemical cost, and reduces the downtime of the equipment. The use of the two step, combination, inventive method of cleaning chemistries that are selectively targeted to remove different types of deposits offers significant cost and thoroughness benefits over chamber cleaning with one step use of the chemicals individually as in the prior art.

BRIEF DESCRIPTION OF THE DRAWINGS

Other objects and advantages of the present invention will become apparent upon reading the detailed description of the invention and the appended claims provided below, and upon reference to the drawings, in which:

FIG. 8 is a table showing the chamber cleaning cost per silicon wafer (200 mm diameter) when practicing an embodiment of the method and system of the present invention.

DETAILED DESCRIPTION OF THE INVENTION

Figure 1:
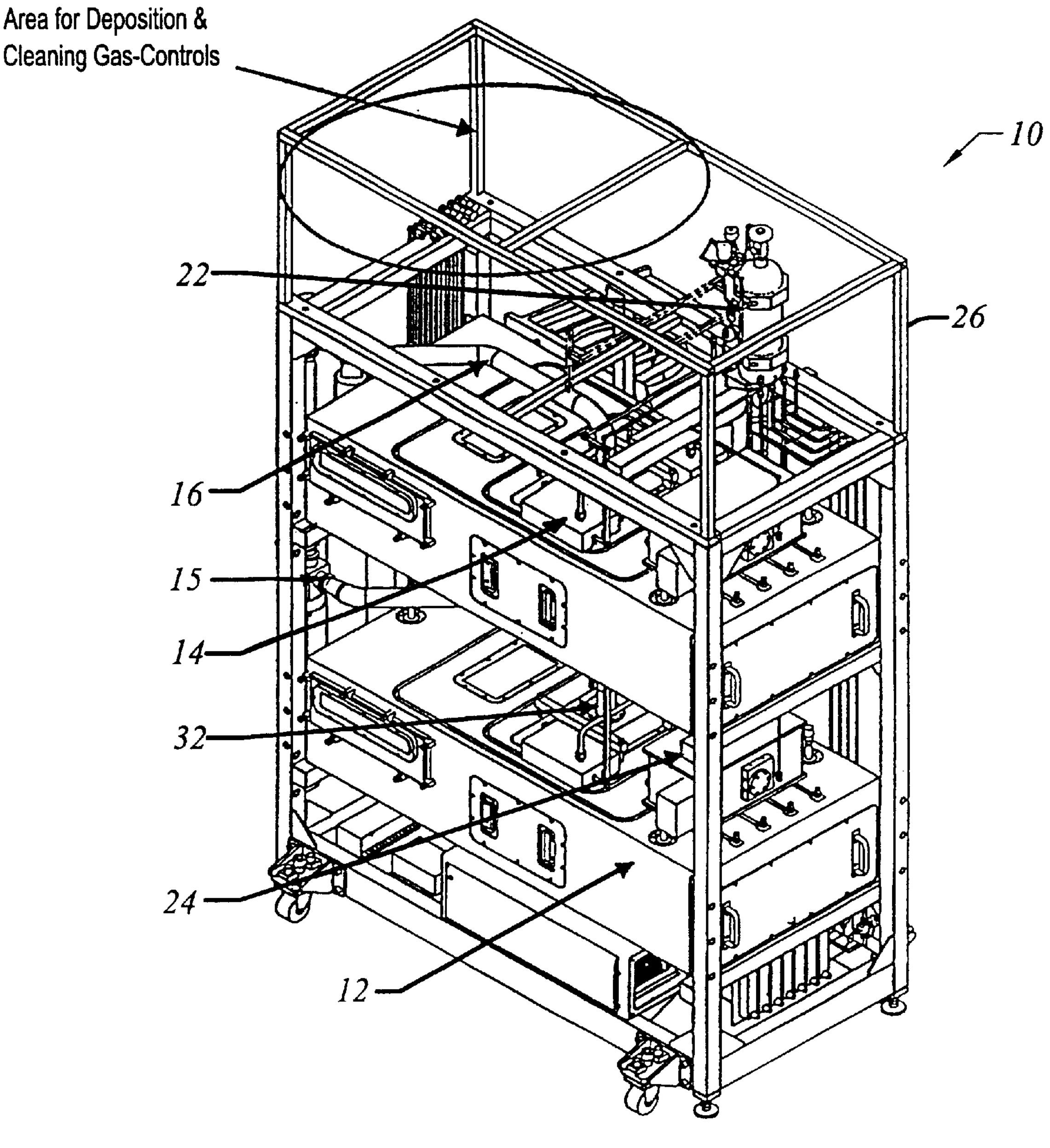
FIG. 1 shows an axonometric view of a CVD system including the in-situ cleaning system according to one embodiment of the present invention. Note that the gas flow controls and major sections of the chamber pressure control system are omitted for clarity.

As described in detail below, the inventors have developed an in-situ, two step or combination, method and system for cleaning of semiconductor manufacturing equipment. The equipment is typically used to deposit silicon containing films or refractory metal films. While described as "two separate steps" it is important to note that the two steps may be repeated, various times and in different order, to form a cleaning sequence as described in detail below. The present invention utilizes two separate chemistries in each step which selectively target the removal of different types of deposits that build up on the equipment surfaces. In particular, powdery and dense film-like solid deposits, as well as a combination of both, build up on the chamber surfaces and associated equipment components. The deposits are by-products of the reactions occurring in the chamber, and when the reaction is deposition of silicon oxide films, the deposits are often comprised of silicates. The powdery deposits are light, loose and sometimes sticky, while the dense deposits are film-like and may form a hard film layer on the equipment surfaces. These two types of deposits are removed selectively by the present invention. Such selective targeting of combined cleaning steps, yields an improved cleaning technique. As used throughout the description, the term "selectively" means that one type of deposit is primarily removed or more effectively removed than the other type of deposit, and the difference in effectiveness may range from slight to great.

Generally, the method and system of the present invention provides for cleaning of the chamber and associated equipment using separate steps with different chemicals, and then performing these steps in a variety of desired sequences. Specific examples of sequences will be described below, but it will be understood by those skilled in the art that different sequences can be employed which are optimized for a particular desired application, based on the teaching of the present invention. Further, the term "cleaning" as used throughout the description refers to cleaning by chemical etching of the deposits.

In general, the method and system of the present invention is carried out by employing two separate steps, that are combined in a sequence to provide the cleaning process. One step delivers a chemical (or a combination of chemicals) that is useful for etching away the powdery deposits; the other step delivers a chemical (or a combination of chemicals) that is useful for etching away the dense film-like deposits.

Any suitable chemical may be used. For example, chemicals suitable for etching of the powdery deposits include, but are not limited to: aHF, and HF vapor (generated from aqueous $HF.H_2O$). Chemicals suitable for etching of the dense film-like deposits include, but are not limited to: atomic-F, and thermally dissociated $ClF_3$. In the preferred embodiment aHF and atomic-F are used.

The method and system of the present invention may be used to clean semiconductor equipment that is used to process many types of wafers, including equipment used to deposit many types of films such, as but not limited to: $SiO_x$ $B_ySiO_x$, $P_zSiO_x$, $B_yP_zSiO_x$, $SiN_x$, $SiC_x$, $W_xSi$ and amorphous or polycrystalline silicon films, and refractory metal films selected from the group of W, Ta, Mo, Co, Ti and Ni.

Turning to FIGS. 1–4, the system of the present invention is illustrated. Specifically, FIG. 1 shows one example of part of a CVD system having a cleaning system according to one embodiment of the present invention. The gas flow controls and major sections of the chamber pressure control system are omitted for clarity. The CVD system 10 generally includes a deposition chamber 12, an injection manifold 14, a chamber exhaust system 15 with associated chamber exhaust ducking 16. Coupled to the deposition chamber is a cleaning subsystem 18 (FIG. 2) which is generally comprised of two cleaning chemical supply systems 22 and 24 which deliver the two different cleaning chemicals independently to the deposition chamber 12. Preferably, the system components are carried in a chassis 26.

Figure 2:
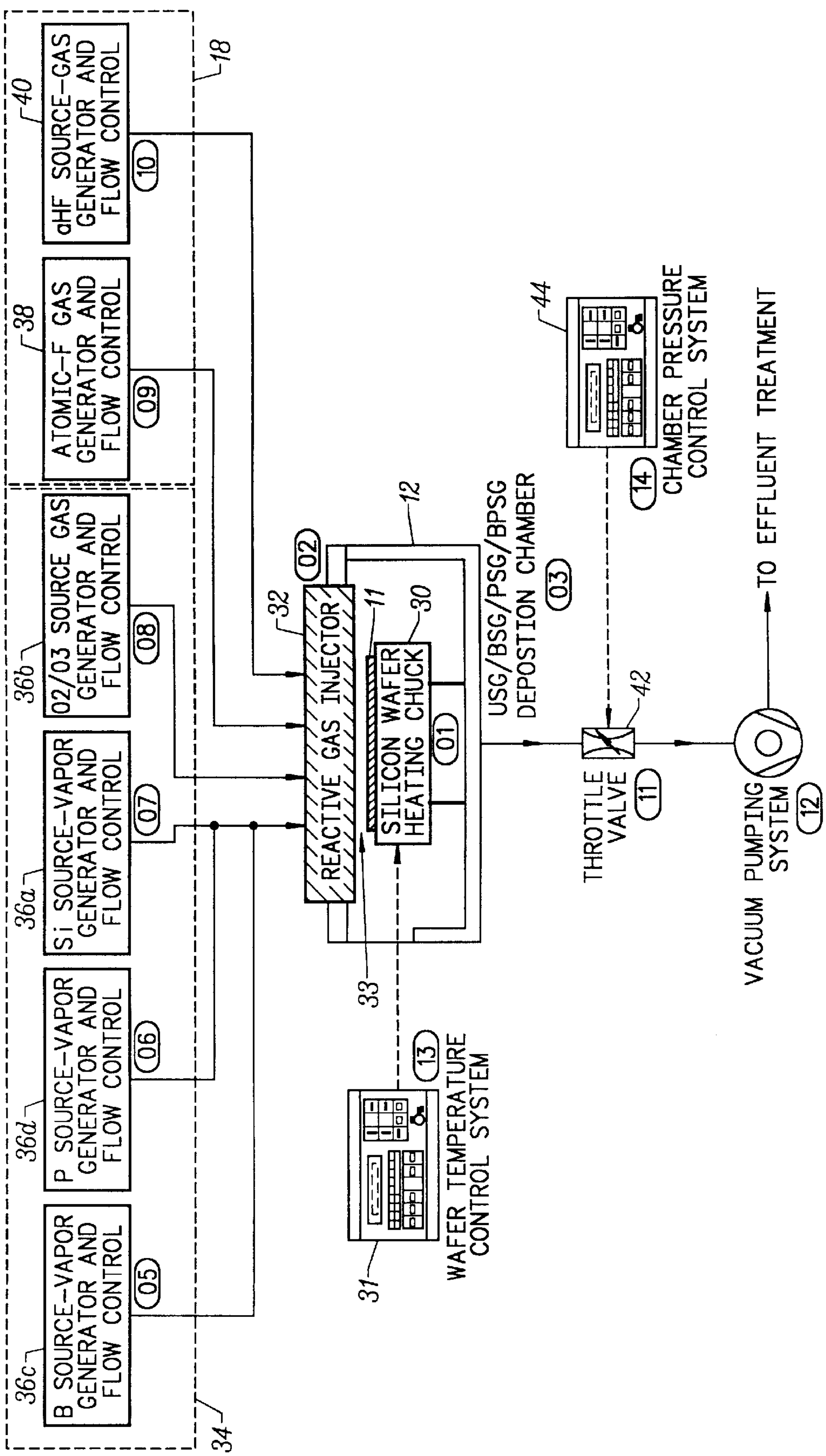
FIG. 2 illustrates a functional block diagram of the system shown in FIG. 1.
Figure 3:
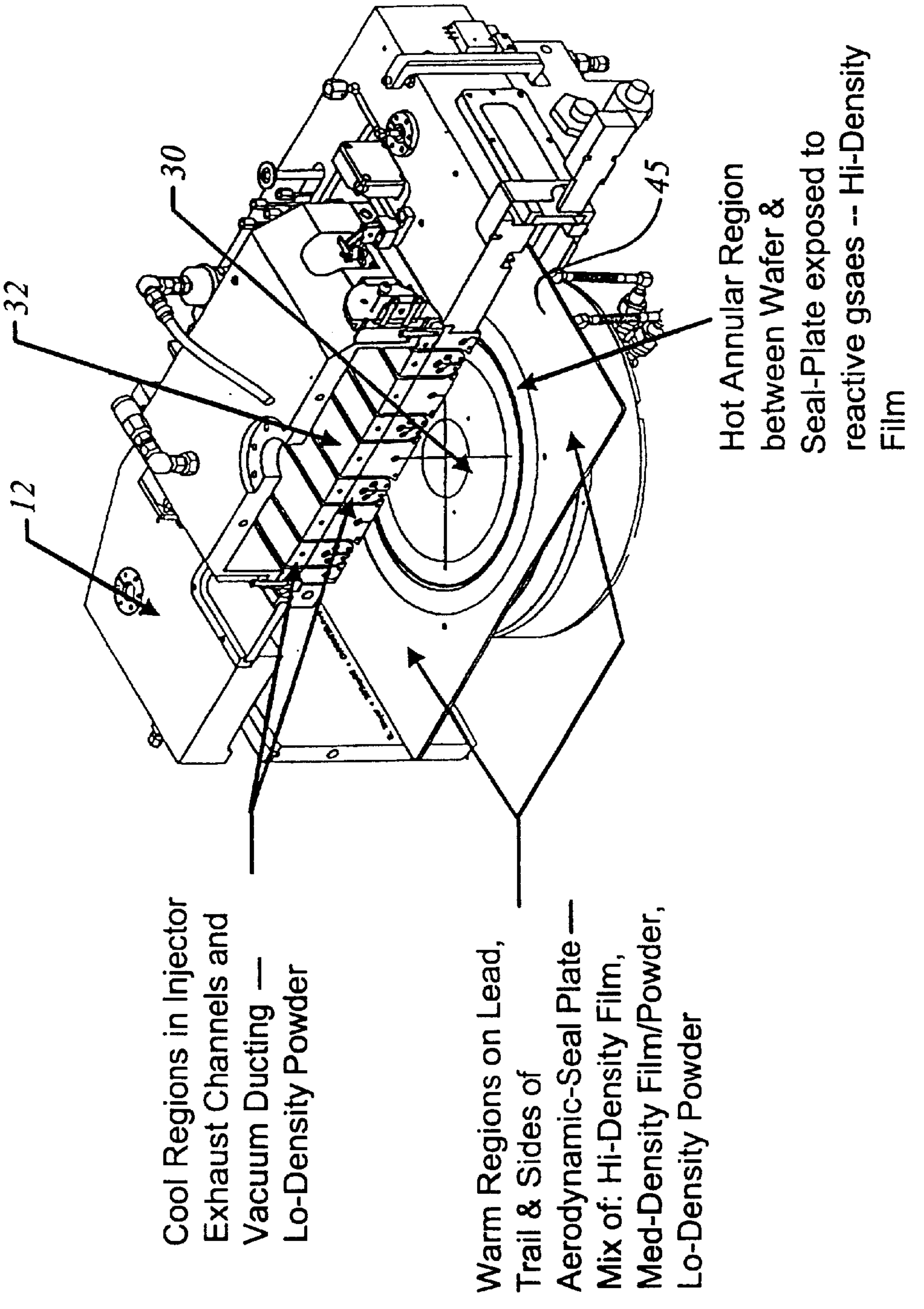
FIG. 3 is a cut-away perspective view of one example of a CVD chamber which may be employed with the method and system of the present invention.

A more detailed view of the system is shown with reference to FIG. 3 and the functional block diagram of FIG. 2. Specifically, the deposition chamber 12 includes a chuck 30, which is a platform used to heat the silicon substrate or wafer 11 to a temperature in the range of about 400–600° C. required for silica-film deposition. A temperature controller 31, operatively coupled to the chuck 30, maintains the wafer 11 and the chuck 30 at the desired process temperature setpoint (typically in the range of about 400–600° C.) to within ±2° C. Such temperature controllers are commercially available, such as from Allen-Bradley Company, Inc., programmable logic controller model SLC 05/4. A reactive or deposition gas dispersion head 32, often referred to as a gas injector, is provided within the injector manifold 14. The injector 32 delivers deposition chemicals to the wafer 11 and may also deliver the cleaning chemicals. If the injector 32 does not distribute the cleaning chemicals, this task is performed by separate hardware (not shown). The injector 32 is most often of a design proprietary to the deposition equipment manufacturer. For example, U.S. Pat. No. 5,683,516 describes one type of injector that may be used with the present invention, and the entire description is hereby incorporated by reference herein. The chamber 12 is most often of a design proprietary to the deposition equipment manufacturer, and is not limited by the specific example shown herein.

The deposition chamber 12 houses the chuck 30 and injector 32. A deposition region 33 is formed between the outlet of the injector 32 and the surface of the wafer 11 where the deposition gases mix and react to form the layer or film on the surface of the wafer 11. Preferably, the deposition region isolates the substrate, deposition gases and cleaning chemicals from the local environment. The chamber is often, but not always, vacuum-sealed during deposition or cleaning. The chamber exhaust system 15 usually includes a valve such as a throttle valve 42 having a butterfly vane (note shown) that changes position in response to commands from a pressure controller 44. The combination of the valve 42 and the controller 44 maintain the pressure in the deposition chamber 12 at a desired value, which is generally in the range of about 200 to 760 Torr during fabrication processing of the wafer, and within about 2% of the pressure setpoint (for example, ±2 Torr at a setpoint pressure of 100 Torr). Throttle valves are commercially available, such as from VAT (Haag, Switzerland) model DN40, series 61.1.

The exhaust system 15 is coupled to a vacuum pumping system (not shown) via the chamber gas exhaust ducting 16. The vacuum pumping system typically includes semiconductor equipment grade vacuum pumps capable of maintaining the deposition chamber at less than about 5 Torr under a gas flow rate load of about 28 slpm. Such pumping systems are commercially available, such as from Busch Vacuum (Maulburg, Germany) model CS-700 or CS-1250.

Figure 4:
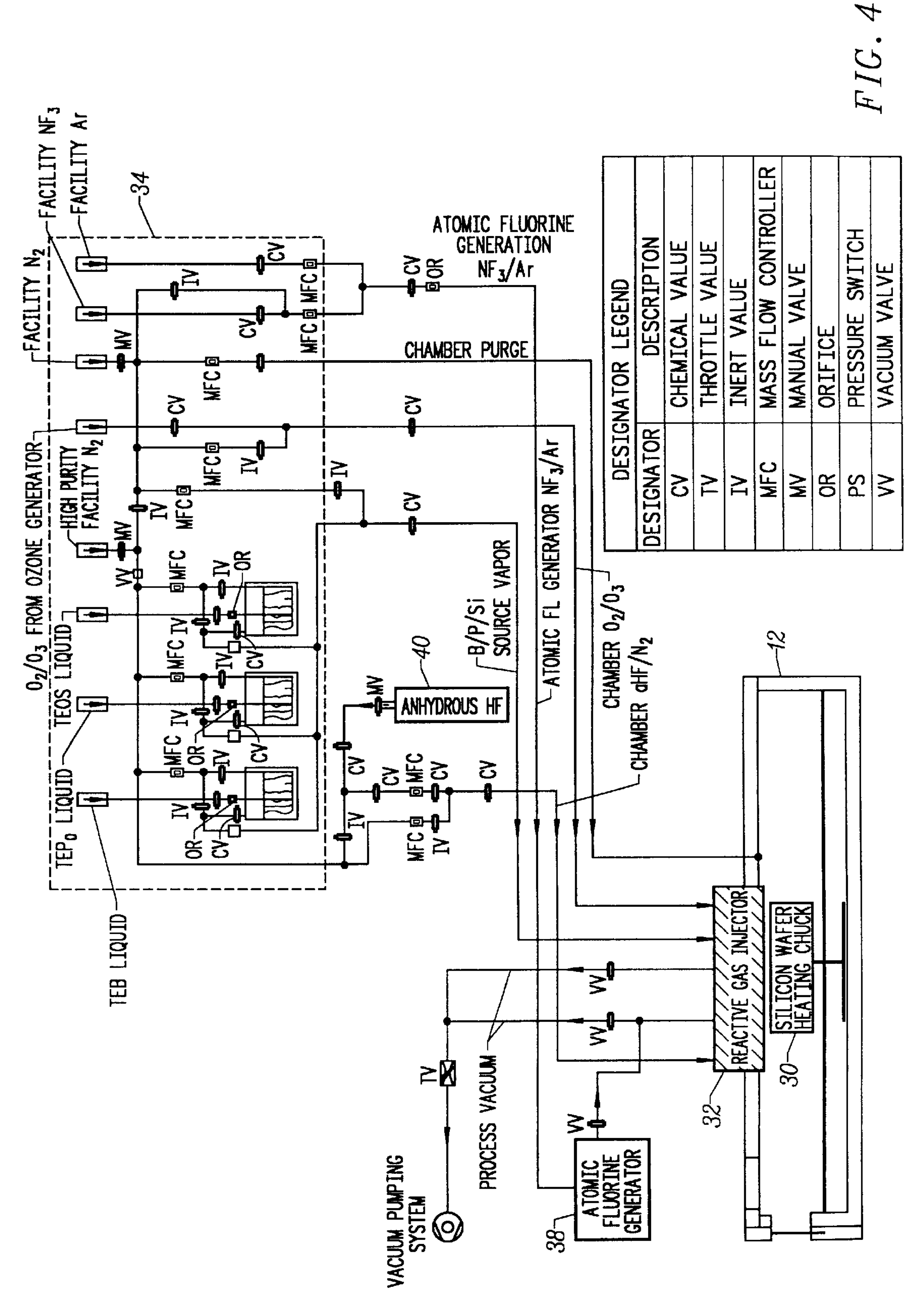
FIG. 4 is a schematic diagram of the gas delivery system of FIG. 2 according to one embodiment of the present invention.

To deposit a desired film on the surface of the wafer 11, a deposition gas delivery system 34, as illustrated in detail in FIG. 4, is coupled to the injector 32 and injector manifold 14. The deposition gas delivery system 34 generally includes one or more deposition gas sources 36. To deposit a doped $SiO_x$ film, the gas delivery system 34 will typically include a silicon source 36*a*, an oxygen/ozone source 36*b*, and any one of, or a combination of a boron source 36*c* and phosphorous source 36*d*. The boron source chemical generator 36*c* contains liquid source boron chemicals such as: trimethyl borate (TMB, CAS[1] #121-43-70), and triethyl borate (TEB CAS #150-46-9). The generation of boron vapor is typically accomplished with either a bubbler or a direct vaporizer as commercially available. The phosphorus source chemical generator 36*d* contains liquid source phosphorus chemicals such as: trimethyl phosphate (TMPo, CAS #512-56-1), trimethyl phosphite (TMPi, CAS #121-45-9), and triethyl phosphate (TEPo CAS #78-40-0). The generation of phosphorus source vapor is typically also accomplished with either a bubbler or a direct vaporizer.

The silicon source chemical generator 36*a* contains liquid source silicon chemicals such as: tetraethyl orthosilicate (TEOS, CAS #78-10-4), and other less important sources. The generation of silicon source vapor is typically accomplished with either a bubbler or a direct vaporizer. The ozone and oxygen source include a generator which ionizes a feed supply of $O_2$ gas and produces an output gas that consists of a mixture of $O_2$ and $O_3$ (oxygen and ozone). Ozone is critical to the formation of silica films from the liquid source chemicals. Such ozone generators are commercially available as in the Astex/Sorbious-GmbH (Woburn, MA, ph 617-933-5560) model SEMOZON 200.3.

Of particular advantage, the method and system of the present invention preferably provides for incorporating the cleaning subsystem 18 within the CVD system 10. The cleaning subsystem 18 is comprised of two or more cleaning gas sources. At least a first cleaning gas source 38 and a second cleaning gas source 40 are provided and deliver at least two different cleaning gases which are used in the separate steps to clean the chamber 12. In this example, the first gas source 38 is comprised of an atomic-F generator which takes a feed supply of $NF_3$+Ar gas mixture and produces an output gas mixture of F+$F_2$+$N_2$+Ar. Atomic-F generators are commercially available such as from Astex, model AX-7650.

In this example, the second gas source 40 is comprised of an anhydrous HF (aHF) source. aHF is commercially available as a very low pressure (boiling point=293 K) compressed gas, such as from Air Products and Chemicals.

As described above, the surfaces of the chambers and associated equipment components become coated with solid byproducts from the thermal reactions during processing of the wafer. Depending on the temperature of the surface, and the surface location relative to the main deposition reaction zone, the surface will become coated with the different types of byproducts; i.e. the powdery or dense film-like deposits or a combination of both. Thus, the different types of deposits tend to develop on different surfaces. FIG. 3 shows how different regions of a conventional TEOS/$O_3$ deposition chamber used to form USG and BPSG films on the wafer, can accumulate different types of solid byproduct deposits. Any chamber surface exposed to the deposition chemicals will become coated with solid byproducts.

Specifically, the physical form of the byproduct deposits will depend upon the temperature of the chamber surface, with higher surface temperatures yielding higher physical-density (i.e. the dense film-like deposits) byproducts. Consider for example the thermal reaction chamber shown in FIG. 3. The injector is typically water cooled to a temperature of less than 100° C. These relatively low temperature surfaces of the injector tend to form the powdery deposit that may include significant amounts of unreacted or partially-reacted deposition chemicals. Deposition of a hard, dense film on the substrate wafer requires that the chuck hold the wafer at about 500° C. and above. Any heated areas not protected from the reactive gases by the wafer will also experience a build-up of the dense, film-like deposits. A aerodynamic-seal plate 45, positioned adjacent the chuck 30, also receives exposure to the deposition chemicals. This seal plate 45 has a large temperature gradient in the chemical exposure areas; and can range from >500° C. in the area adjacent to the chuck, to <100° C. far away from the chuck. The seal plate 45 thus collects deposits of varying density, from the dense, film-like deposits to the powdery deposits.

According to the present invention, the use of fluorine chemistry has proven to be quite effective for cleaning semiconductor equipment used to deposit the USG/BSG/PSG/BPSG family of silicon oxide films. While not wishing to be bound by any one particular theory, the inventors believe that the basis of the clean mechanism in each of the separate steps is etching by the formation of volatile $SiF_4$. $SiF_4$ has a boiling point of only 187 K (−86° C.) at one atmosphere pressure. Thus, the formation of $SiF_4$ by the etch reactions assures gaseous removal of the silicon from the chamber surfaces. The fluorine required for $SiF_4$ formation may be supplied from a number of fluorine containing chemical compounds including, but not limited to: liquid hydrous hydrofluoric acid, gaseous anhydrous hydrogen fluoride (aHF) and gaseous atomic fluorine (atomic-F). The atomic-F is created by in-situ or remote plasma-cracking of $CF_4$, $C_2F_6$, $C_3F_8$, $SF_6$, $NF_3$; or by thermal cracking of $NF_3$ or $ClF_3$. As described above, aHF and atomic-F are the two preferred chemicals for the two step cleaning method of the present invention.

The primary chemical reactions during the cleaning method and system of the present invention when using aHF and atomic-F as the cleaning chemicals for chambers used to deposit the USG/BSG/PSG/BPSG family of films, can be described conceptually by the following chemical reactions:

$$SiO_2+4HF \rightarrow SiF_4+2H_2O \quad (1)$$

$$B_ySiO_x+bHF \rightarrow SiF_4+2H_2O+(y/3)H_3BO_3 \quad (2)$$

$$P_zSiO_x+cHF \rightarrow SiF_4+2H_2O+(z/3)H_3PO_4 \quad (3)$$

$$B_yP_zSiO_x+dHF \rightarrow SiF_4+2H_2O+(y/3)H_3BO_3+(z/3)H_3PO_4 \quad (4)$$

$$SiO_2+4F \rightarrow SiF_4+O2 \quad (5)$$

$$B_ySiO_x+kF \rightarrow SiF_4+O_2+yBF_3 \quad (6)$$

$$P_zSiO_x+mF \rightarrow SiF_4+O_2+zPF_5 \quad (7)$$

$$B_yP_zSiO_x+nF \rightarrow SiF_4+O_2+yBF_3+zPF_5 \quad (8)$$

where: b, c, d, k, m, and n are "rich-reaction" constants that are in the range of 4 to 1000, and which provide more than a sufficient number of fluorine atoms available to form the boron, phosphorus, and silicon compounds shown on the right-hand-side of the equations.

Figure 5:
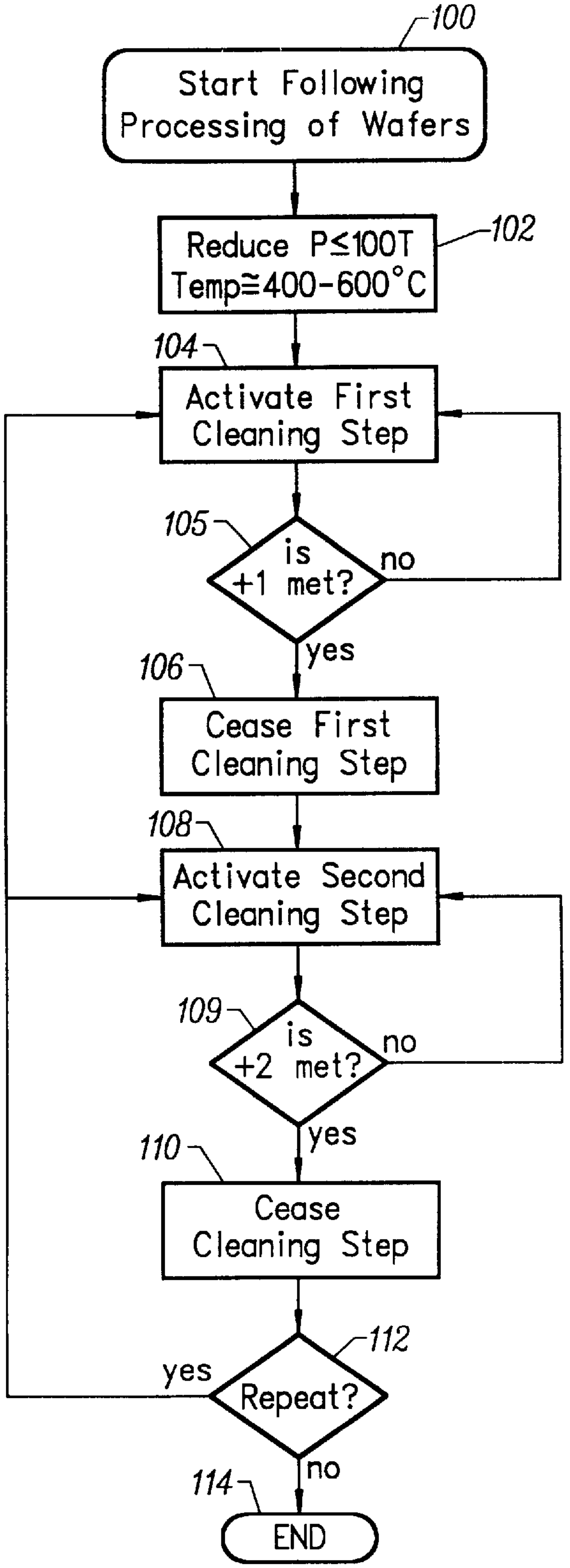
FIG. 5 is a flow chart depicting the method of the present invention according to one embodiment.

The method of cleaning according to the present invention is now described in detail. In general, the powdery deposits are cleaned first and then the dense, film-like deposits are cleaned second. However, it is to be understood that this is not a requirement, and that the order of cleaning may be reversed. Referring to FIG. 5 the method of the present invention according to one exemplary embodiment is illustrated. In general, the method begins at step 100 following processing of the wafers. At this time, deposits of the two different types (and mixtures thereof) have built up on the surfaces of the chamber and associated equipment components. The cleaning method begins by reducing the pressure in the chamber to about 100 Torr and below, and heating the chuck in the chamber to a temperature in the range of about 400 to 600° C. at step 102. At step 104, the first cleaning step is activated by introducing a first fluorine containing gas into the chamber. The first cleaning step is carried out for a desired time "t1" (at step 105) to etch one of the two types of deposits from the chamber surfaces and associated equipment. The first cleaning step is ended at step 106. Thereafter, the second cleaning step is activated at step 108 by introducing a second fluorine containing gas into the chamber. The second cleaning step is carried out for a desired time "t2" (at step 109) to etch the other one of the two types of deposits from the chamber surfaces and associated equipment. The second cleaning step ceases at step 110. Any one of the first or second cleaning steps may be repeated (at step 112) as desired. The cleaning sequence ends at step 114.

More particularly, when the powdery type deposits are to be cleaned, the fluorine containing gas is selected as aHF. When the dense, film-like deposits are to be cleaned, the fluorine containing gas is selected as atomic-F. While any of the fluorine containing gases may be used; the inventors have discovered that aHF, while being preferred for removing the powdery deposits, is inefficient at removing the dense, film-like deposits. Also, while atomic-F is preferred for removing the dense, film-like deposits, it has been found to be inefficient at removing the powdery type deposits.

Each cleaning step is carried out for a separate time t1 and t2. The exact amount of cleaning time t1 and t2 for each step will vary depending on the type and thickness of the deposits built up on the chamber and other surfaces, and on the etching rate of the cleaning chemical. In one exemplary embodiment, the powdery type deposits have an accumulated thickness on the chamber and other surfaces in the range of about 1 to 25 microns, with a typical thickness of about 4 microns at the start of the cleaning method. The dense, film-like deposits have an accumulated thickness on the chamber and other surfaces in the range of about 4 to 50 microns, with a typical thickness of about 25 microns at the start of the cleaning method. Based on such buildup, the first cleaning step to remove the powdery deposits is generally carried out for a time t1 in the range of about 1 to 10 minutes. The second cleaning step to remove the dense film-like deposits is generally carried out for a time t2 in the range of about 5 to 60 minutes. Examples of etching rates for both aHF and atomic-F for different types of deposits are shown in Table 1 below:

travel a similar path as the deposition or reactive gases. Additionally, such a scheme minimizes the need for additional hardware. Alternatively, however the first and second gases may be introduced to the chamber via separate hardware means, such as one or more separate gas inlets.

The fluorine containing gases selected for each of the cleaning steps are supplied by conventional means. For example, when aHF is used, it is generally supplied by a gas supply canister 22, positioned remote from the chamber and then coupled to the chamber via gas delivery lines. As described above conventional gas controllers are used to convey the aHF gas from the supply canister 22 to the chamber 12 at the desired time and flow rate. When atomic-F is selected as a cleaning gas, it is preferably generated by an atomic-F generator 24 positioned remote from the chamber and then coupled to the chamber via gas delivery lines. Preferably, the different types of cleaning chemicals are independently and separated supplied to the chamber 12. As described above, atomic-F may be generated from a variety of sources. In the preferred embodiment, atomic-F is generated by a plasma generator using NF3 as the precursor gas with argon and operated at a power of 2000 watts and above to form the atomic-F. The argon to NF3 flow rate ratio to the plasma generator is in the range of about 1 to 10, with a ratio of about 7.5 being preferred.

The cleaning gases are typically introduced to the chamber at a flow rate in the range of about 0.5–2.5 slpm. This range may vary depending on the type of fluorine containing cleaning gas used, and the exact ranges may be determined by routine experimentation. In one exemplary embodiment where aHF is used as a cleaning gas, aHF is introduced to the chamber at a flow rate in the range of about 0.5–2.5 slpm, with a flow rate of about 2 slpm being most preferred. In another exemplary embodiment where atomic-F is used as a cleaning gas, atomic-F is introduced to the chamber at a flow rate in the range of about 0.5–2.5 slpm with a flow rate of about 1.2 slpm being most preferred.

As the cleaning steps are carried out, the pressure and temperature of the chamber are maintained at certain values. The temperature and/or pressure in each of the first and second cleaning steps may be different. Such differences are due primarily to the different chemicals used in the first and

TABLE 1

| Cleaning | BPSG Film ($\mu$m/min) | | BPSG Powder ($\mu$m/min) | | USG Film ($\mu$m/min) | | USG Powder ($\mu$m/min) | |
|---|---|---|---|---|---|---|---|---|
| Chemical | Range | Nom | Range | Nom | Range | Nom | Range | Nom |
| aHF | 0.05–0.4 | 0.3 | 0.5–2.0 | 1.0 | ≈0 | ≈0 | 0.05–0.3 | 0.2 |
| atomic-F | 1.0–4.0 | 3.0 | 1.0–3.0 | 1.7 | 0.4–1.2 | 0.6 | 0.3–0.9 | 0.6 |

notes:
i. For a nominal silicon-wafer heating-chuck temperature of 500° C.
ii. "Nom" refers to the current best-practice nominal, or preferred, value
iii. Clean Rates in [Wafer-accumulated $\mu$m]/min.

Of significant advantage, Table 1 shows that cleaning rates as high as 2 microns per minute for the powdery deposits and 4 microns per minute for the dense film-like deposits are achieved by the method and system of the present invention.

In general, the first and second cleaning gases are generated and/or supplied remotely from the chamber, and may be introduced to the chamber in a number of ways. Preferably, the first and second cleaning gases are introduced to the chamber through the injector 32. Introducing the cleaning gases through the injector 32 causes the cleaning gases to second cleaning steps. For example, when carrying out a cleaning step with aHF as the cleaning gas, the pressure in the chamber is maintained in the range of about 200 Torr or less, more preferably in the range of about 50 to 200 Torr, with a pressure of about 100 Torr being most preferred. Conversely, when carrying out a cleaning step with atomic-F as the cleaning gas, the pressure in the chamber is maintained in the range of about 10 Torr or less, more preferably in the range of about 1 to 10 Torr, with a pressure of about 8 Torr being most preferred. The temperatures of the surfaces to be cleaned do not change during the first and second cleaning steps, with the chuck maintained at a temperature in the range of about 400 to 600° C., with about 500° C. being most preferred. An example of typical process conditions for the two separate cleaning steps using two different fluorine containing chemicals are shown in Table 2 below:

TABLE 2

| Cleaning | Chamber Pressure (Torr) | | Clean Chemical Flow Rate (slpm) | | $Ar:NF_3$ Flow-Rate Ratio | |
|---|---|---|---|---|---|---|
| Chemical | Range | Nom | Range | Nom | Range | Nom |
| aHF | 50–200 | 100 | 1–2 | 2 | n/a | n/a |
| atomic-F | 1–10 | 8 | 1–2 | 1.2 | 1–10 | 7.5 |

NOTES:
i. "n/a" denotes "not applicable".

As mentioned above, the first and second cleaning steps may be repeated to form a cleaning sequence. Of particular advantage, the combination cleaning method of the present invention can be carried out in a cleaning sequence which utilizes both types of cleaning chemistry in the two steps, in a desired order and frequency, such that production uptime is maximized, and cleaning chemical costs are minimized. Further, the combination cleaning method and system of the present invention offers a technique that provides a large amount of flexibility. Through system-performance and cost-optimization techniques, a cleaning sequence "strategy" can be developed that is tailored the particular application at hand. The method and system of the present invention provides a combination of two separate cleaning steps which utilize different chemicals that selectively clean, i.e. etch away, the different types of deposits, thereby improving the effectiveness of the overall cleaning process. Although not required by the present invention; in the preferred embodiment, the two separate steps are performed in a sequence, and repeated, to provide the optimal cleaning effectiveness. The particular sequencing choice for cleaning a chamber used to deposit a USG/BSG/PSG/BPSG family of films according to one embodiment of the present invention depends on several factors, including:

(1) the etch or cleaning rates; fast cleaning rates are desired to minimize the cleaning-related downtime, as well as the cleaning chemical costs;

(2) the dollar ($) cost for a unit (usually a standard liter) of cleaning source chemical; low cost, readily available source chemicals are obviously preferred; and (3) the formation of nonvolatile liquid or solid residues; since a system using TEOS+Ozone deposition gases typically uses only thermal energy (as opposed to plasma energy) to create the deposition reaction, evaporation is the only method for removing cleaning products from the chamber.

The cleaning sequence is defined in the following manner. In general, the cleaning sequence involves repeating the first and/or second cleaning steps, in a certain order and frequency, at certain stages within the production process. For example, if a particular production process tends to generate a rapid build up of the powdery deposits and a slower buildup of the dense film-like deposits, then the cleaning step that is most effective at removing the powdery deposits will be initiated and repeated more frequently than the other cleaning step which is more effective at removing the dense deposits.

Specifically, the cleaning sequence includes the following parameters. A mean wafer between cleaning (MWBC) frequency is established for the first cleaning step (MWBC-step 1). For purposes of this description, the first cleaning step is selected to be the step which targets the removal of the powdery deposits, which preferably uses aHF as the first cleaning chemical. The MWBC-step 1 occurs every "M" number of wafers. The value of M may be any desirable number and will typically be selected such that the deposit buildup does not become so great as to adversely effect the processing of the wafers. Examples of typical values of M include, but are not limited to, integers in the range of about 20 to 50.

A mean wafer between cleaning (MWBC) frequency is established for the second cleaning step (MWBC-step 2). The second step targets the removal of the dense film-like deposits, which preferably uses atomic-F as the second cleaning chemical. The definitions of the first and second steps are established for convenience only, and can be reversed. The MWBC-step 2 occurs every "N" number of wafers. The value of N may be any desired number. Examples of typical values of N include, but are not limited to, integers in the range of about 5 to 100. Generally, but not necessarily, the value of N will be equal to or greater than M.

The values of M and N define a cleaning ratio C. The value of C will be the larger of M/N or N/M, with M usually as the denominator. C is usually an integer with $C \geqq 1$, and more usually C is in the range of about 1 to 5.

Cleaning steps one and two may be performed in back to back sequence, or alternatively wafers may be fabricated between the steps. Any variety or combination of cleaning steps may make up the cleaning sequence. The primary criteria for establishing the cleaning sequence is the nature of the deposit buildup and the frequency of the deposit buildup. For example, the following sequences may be used:

(1) Step 1 (aHF chemical)→Step 2 (atomic-F)→Step 1→Step 2

(2) Step 1→fabricate wafers→Step 1→fabricate wafers→Step 1→Step 2

(3) Step 1→Step 1→Step 2→Step 2

(4) Step 2→Step 1→Step 2

Further, additional processes may be performed between, or at the beginning or end of, the steps. For example, an inert gas chamber purge may be performed prior to the start of the first cleaning step. Also, following the last cleaning step, a post clean deposition process may be performed to "season" the chamber prior to resuming fabrication of the wafers.

By way of illustration, and not by way of limitation, examples of a cleaning sequence according to two embodiments of the present invention are provided below:

EXAMPLE 1

Figure 6:
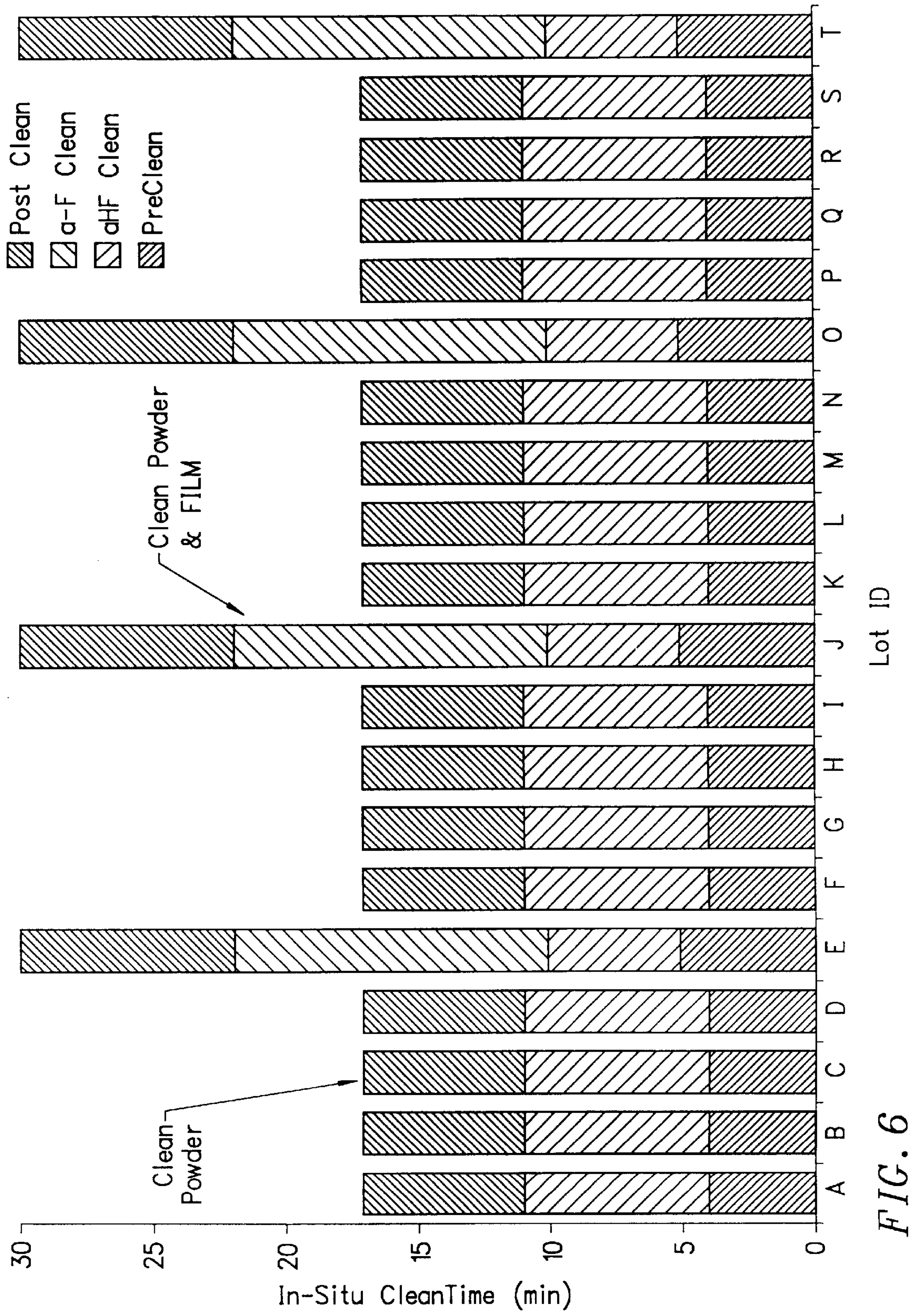
FIGS. 6 and 7 are graphs illustrating the in-situ cleaning time for a variety of cycles described in Examples 1 and 2, respectively, according to the present invention.

In example 1, the value of M is 20, N is 100 giving a ratio C of 5. The cleaning sequence is selected as:

1. Complete deposition on production wafer, M=20,
2. Perform pre-clean inert-gas chamber purge if needed,
3. Reduce the pressure in the chamber to 100 Torr,
4. Initiate Step 1—Clean powder from chamber interior using aHF,
5. Cease Step 1—Stop aHF flow,
6. Perform post-clean inert gas purge of chamber,
7. If required to reduce the "first-wafer effect", perform a post-clean deposition to "season" the chamber for subsequent product wafers,
8. Restart production deposition of wafers and repeat steps 1–7 four more times,
9. Complete deposition on production wafer, N=100,
10. Perform pre-clean inert-gas chamber purge if needed,
11. Reduce the pressure in the chamber to 100 Torr, 12. Initiate Step 1—Clean powder from chamber interior using aHF,
13. Cease Step 1—Stop aHF flow,
14. Perform an "inter-clean" inert-gas chamber purge if needed,
15. Reduce the chamber pressure to 5 Torr,
16. Initiate Step 2—Clean dense film-like deposits from chamber interior using atomic-F,
17. Cease Step 2—stop atomic-F flow;
18. Perform post-clean inert gas chamber purge,
19. If required to reduce the "first wafer effect", perform a post-clean deposition to "season" the chamber for subsequent product wafers,
20. Resume production wafer deposition, and restart cleaning method from step-1 when M 20. A simplified graphical representation of the cleaning sequence of Example 1 is shown in FIG. 6.

EXAMPLE 2

Figure 7:
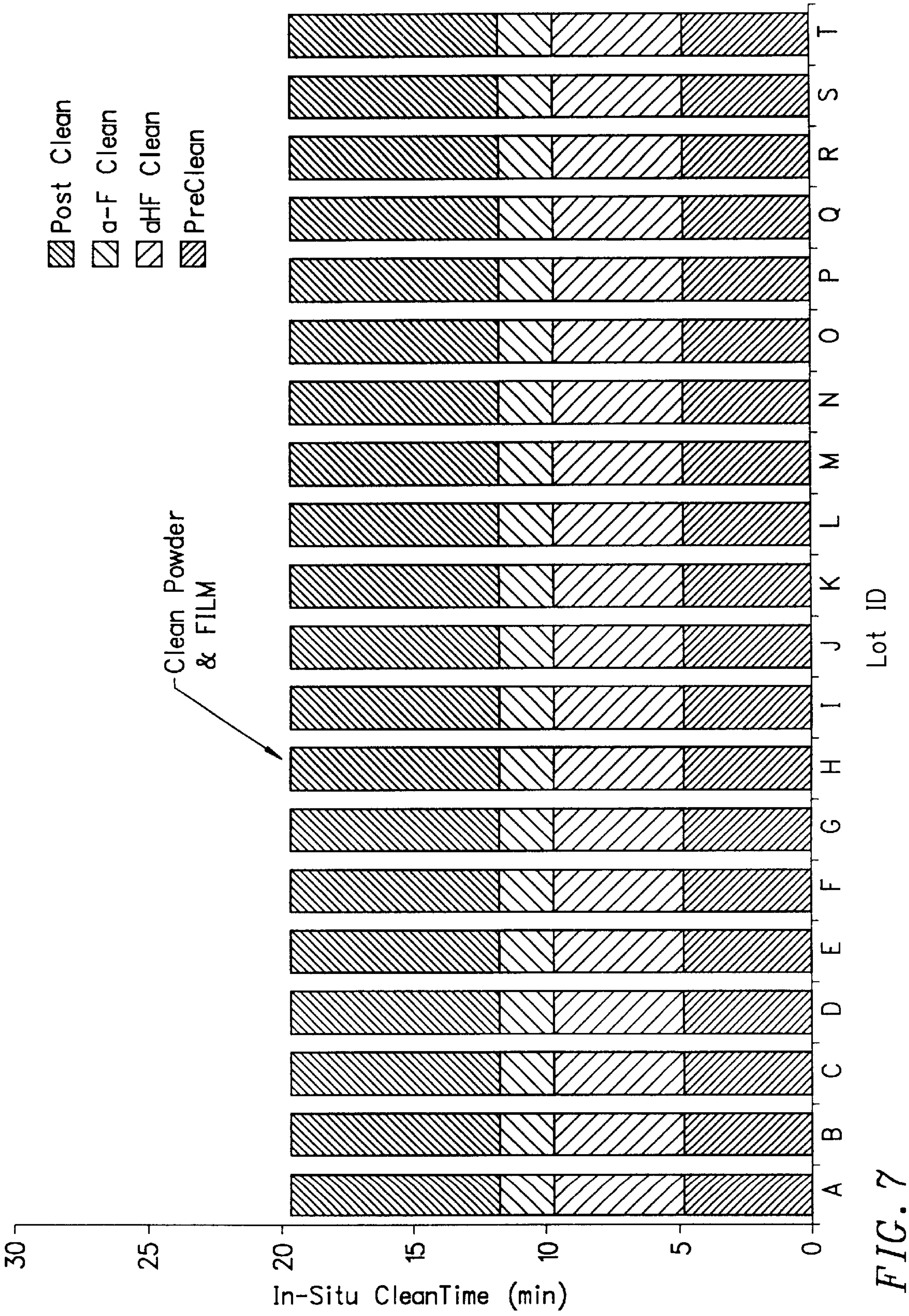

In Example 2, the value of M and N are 25, giving a ratio C of 1. The cleaning sequence is selected as:

1. Complete deposition on production wafers, M=25,
2. Perform pre-clean inert-gas chamber purge if needed,
3. Reduce the pressure in the chamber to 100 Torr,
4. Initiate Step 1—Clean powder from chamber interior using aHF,
5. Cease Step 1—Stop aHF flow,
6. Perform an "inter-clean" inert-gas chamber purge if needed,
7. Reduce the chamber pressure to 5 Torr,
8. Initiate Step 2—Clean dense film-like deposits from chamber interior using atomic-F,
9. Cease Step 2—Stop atomic-F flow,
10. Perform post-clean inert gas chamber purge,
11. If required to reduce the "first wafer effect", perform a post-clean deposition to "season" the chamber for subsequent product wafers,
12. Resume production wafer deposition, and restart cleaning method from step-1 when M=25. A simplified graphical representation of the cleaning sequence of Example 2 is shown in FIG. 7.

Example 1 appears significantly more complex than Example 2. However, all the steps in either cleaning sequence can be easily automated with modem semiconductor equipment control software, such as "ControlWORKS" available from Adventa Control Technologies, Inc.

Of particular advantage, the method and system of the present invention provide a cost effective means of cleaning semiconductor manufacturing equipment. FIG. 8 depicts a table showing calculations of the chamber cleaning cost per coated-200 mm diameter silicon wafer for aHF or atomic-F chemistry. This calculation takes capital cost, production-rate, clean-rate and chemical costs into account. The calculation shows that aHF is more economical for powder-cleaning, while atomic-F has a slight cost advantage for film-cleaning.

While the cost to atomic-F clean undoped silicate glass (USG) powder deposits clearly eliminates consideration of an atomic-F only cleaning system, the costs to aHF clean the USG and BPSG powder do not greatly exceed the atomic-F costs. Recall that generation of atomic-F requires costly and complex plasma cracking of a fluorine source such as $NF_3$. This seems to imply that an aHF-only cleaning system would be a good, moderate per-wafer cost, low-complexity cleaning strategy. This concept suffers, however, from two very serious flaws:

The aHF etch rate for dense film-like USG deposits is very nearly zero as noted in Table I. This lack of an in-situ clean would then require the system user to manually clean the chamber on a periodic basis. As discussed earlier, system users wish to avoid manual cleaning.

Further, aHF etching of BPSG deposits forms a tenacious ($H_3PO_4$) phosphoric acid liquid/solid residue. Phosphoric Acid had a melting point of42.35° C. and thus resists evaporative removal from cool parts of the deposition system. In addition, $H_3PO_4$ can dehydrate to form glassy $H_4PO_7$, which is even more difficult to evaporate. Removal of these residues using this one step alone would require a manual wipe-down clean of the deposition chamber interior.

While the amount of aHF-created BPSG residue can be minimized by cleaning at low chamber pressures, preferably at pressures of ≦100 Torr, it cannot be completely eliminated. In addition, most TEOS+Ozone based thermal deposition systems are capable of depositing both USG and BPSG. Accordingly such deposition systems can then greatly benefit from an in-situ cleaning method and system of the present invention which combines the best features of the two step aHF and atomic-F cleaning chemistries. With this aHF+atomic-F combination two step clean method the cost-to-clean in a silicon-wafer USG/BPSG deposition system can be minimized.

It is important to note, that while described in detail, the method and system of the present invention is not limited to aHF and atomic-F. Any combination of two or more different cleaning reactions may be advantageous depending upon the details of the deposition process, and the chamber construction. For example, a combination clean that consists of HF vapor generated from aqueous ($HF.H_2O$) and thermally dissociated $ClF_3$ may be desired in certain circumstances.

As taught by the foregoing description and examples, an improved method and system for cleaning semiconductor manufacturing equipment has been provided by the present invention. The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and their equivalents.

We claim:

1. A method of cleaning deposits in semiconductor manufacturing equipment wherein there are different types of deposits including powdery and dense film-like deposits, characterized in that the equipment is cleaned using two separate steps, each of said steps using different fluorine containing chemicals to selectively clean the different deposits.

2. The method of claim 1 wherein the equipment is used to deposit silicon containing films and refractory metal films.

3. The method of claim 2 wherein the silicon containing films are selected from the group of $SiO_x$ $B_ySiO_x$, $P_zSiO_x$, $B_yP_zSiO_x$, $SiN_x$, $SiC_x$, $W_xSi$ and amorphous or polycrystalline silicon, and the refractory metal films are selected from the group of W, Ta, Mo, Co, Ti and Ni.

4. The method of claim 1 where the fluorine containing chemicals are selected from the group of: hydrogen fluoride (HF), atomic fluorine (atomic-F), anhydrous hydrogen fluoride (aHF), and $ClF_3$.

5. The method of claim 4 where the atomic-F is generated using plasma generator.

6. The method of claim 4 where the atomic-F generated from any one of: $NF_3$, $CF_4$, $C_2F_6$, $C_3F_8$, $SF_6F_2$, or $ClF_3$.

7. The method of claim 1 wherein one of the two separate steps uses anhydrous hydrogen fluoride (aHF) to selectively clean the powdery deposits.

8. The method of claim 1 wherein one of the two separate steps uses atomic-F to selectively clean the dense film-like deposits.

9. The method of claim 1 wherein the method is carried out at a pressure of less than or equal to about 100 Torr.

10. A method of in-situ cleaning a chamber containing both powdery and dense film-like silicate deposits, comprising the steps of:

first cleaning one of the powdery type or dense film-type deposits with a first fluorine containing cleaning gas that etches primarily the one type of deposit; and second cleaning the other of the powdery type or dense film type deposit with a second fluorine containing cleaning gas that etches primarily the other type of deposit.

11. The method of claim 10 wherein the silicate deposits may include any one of: $SiO_x$ $B_ySiO_x$, $P_zSiO_x$, $B_yP_zSiO_x$, $SiN_x$, $SiC_x$, $W_xSi$, amorphous silicon and polycrystalline silicon.

12. The method of claim 10 where the first and second fluorine containing chemical is selected from the group of: hydrogen fluoride (HF), atomic fluorine (atomic-F), anhydrous hydrogen fluoride (aHF), and $ClF_3$.

13. The method of claim 12 where the atomic-F generated from any one of: $NF_3$, $CF_4$, $C_2F_6$, $C_3F_8$, $SF_6$, $F_2$, or $ClF_3$.

14. The method of claim 10 wherein the first and second fluorine containing gases are independently aHF and atomic-F.

15. The method of claim 10 wherein the first fluorine containing gas is aHF and is used to clean primarily the powdery deposits.

16. The method of claim 10 wherein the second fluorine containing gas is atomic-F and is used to clean primarily the dense film-like deposits.

17. The method of claim 10 wherein any one of, or both of, the first and second cleaning steps are repeated.

18. The method of claim 10 wherein the first and second cleaning steps are carried out at a pressure of less than or equal to about 100 Torr.

19. The method of claim 10 wherein one of the first or second cleaning steps is carried out at a pressure of about 5 Torr.

20. The method of claim 10 wherein the first and second cleaning steps are carried out at a temperature in the range of about 400 to 600° C.

21. The method of claim 10 wherein the first and second cleaning steps are carried out independently for a time in the range of about 1 to 60 minutes.

* * * * *